United States Patent [19]

Walker

[11] Patent Number: 5,330,359
[45] Date of Patent: Jul. 19, 1994

[54] SOCKET FOR STACKING INTEGRATED CIRCUIT CHIPS

[75] Inventor: Kevin E. Walker, Harrisburg, Pa.

[73] Assignee: The Whitaker Corporation, Wilmington, Del.

[21] Appl. No.: 38,738

[22] Filed: Mar. 26, 1993

[51] Int. Cl.$^5$ .............................................. H01R 9/09
[52] U.S. Cl. ........................................ 439/69; 439/83
[58] Field of Search ................. 361/393, 395; 439/69, 439/70, 72, 83, 874, 876, 331

[56] References Cited

U.S. PATENT DOCUMENTS

| | | | |
|---|---|---|---|
| 3,164,750 | 1/1965 | Miller | 439/69 X |
| 3,302,067 | 1/1967 | Jackson et al. | 439/69 X |
| 4,018,494 | 4/1977 | Scheingold et al. | |
| 4,080,026 | 3/1978 | Gianni | |
| 4,116,519 | 9/1978 | Grabbe et al. | |
| 4,192,565 | 3/1980 | Gianni | |
| 4,312,555 | 1/1982 | Donaher et al. | |
| 4,341,433 | 7/1982 | Cherian et al. | 439/331 X |
| 4,398,235 | 8/1983 | Lutz et al. | |
| 4,406,508 | 9/1983 | Sadigh-Behzadi | |
| 4,437,718 | 3/1984 | Selinko | |
| 4,696,525 | 9/1987 | Coller et al. | 439/69 |
| 4,729,739 | 3/1988 | Coffee et al. | 439/71 |
| 4,872,843 | 10/1989 | Anstey | 439/69 |
| 4,883,428 | 11/1989 | Tonooka | 439/69 |

OTHER PUBLICATIONS

IBM Technical Disclosure, vol. 14, No. 10, Mar. 1972.

Primary Examiner—Khiem Nguyen
Attorney, Agent, or Firm—Robert J. Kapalka

[57] ABSTRACT

A socket supports a plurality of integrated circuit chips in a vertical stack and interconnects the chips to circuit traces on a substrate. The socket includes a dielectric base having a top surface and a bottom surface. The base holds a plurality of electrical contacts. Each of the contacts has a foot portion which extends below the bottom surface for electrical connection with one of the traces, and a main body portion which extends above the top surface for electrical connection with respective electrical leads extending from the chips. Each of the main body portions has a solder coating on one side. The contacts are arranged such that the solder coated sides abut their respective leads, and the contacts are electrically connectable with the leads by reflow of the solder coating.

11 Claims, 4 Drawing Sheets

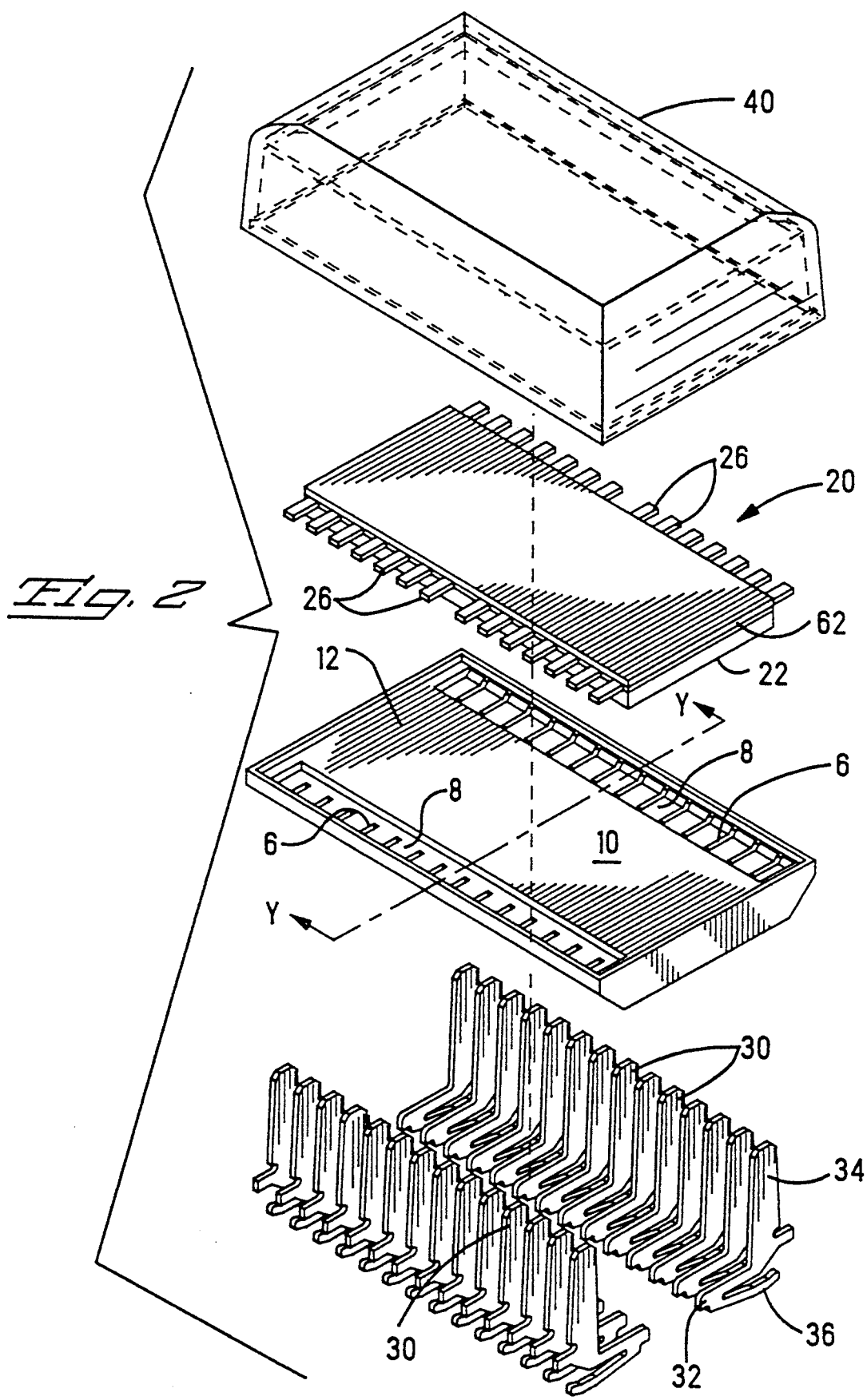

SOCKET FOR STACKING INTEGRATED CIRCUIT CHIPS

BACKGROUND OF THE INVENTION

1. Field of the Invention

The invention relates to a socket for electrically interconnecting a stack of integrated circuit chips in a single package.

2. Prior Art

Sockets are known for multi-level stacking of integrated circuit packages. For example, U.S. Pat. No. 4,080,026 to Gianni discloses a socket for stacking dual in-line packages (DIP's) to provide an increased memory capacity without increasing the area covered on a printed circuit board. These dual in-line packages comprise an integrated circuit chip interconnected to a thin metal strip, or leadframe, having a network of wires which define leads for the integrated circuit chip. The chip is totally enclosed in an overmolded dielectric body, and leads of the leadframe are partially enclosed within the body and extend therefrom. The dielectric body generally includes top and bottom surfaces, and side and end walls. The leads extend outwardly from the side walls and bend downwardly. The socket taught by Gianni has metallic contact members that receive the leads from the DIP's that are stacked within the socket. The contact members extend from a bottom of the socket and engage an associated printed circuit board to which they are soldered. In the socket taught by Gianni, the contact members are retained individually in the socket, thus causing manufacturing and handling difficulties.

U.S. Pat. No. 4,696,525 to Coller et al. discloses a socket for stacking integrated circuit packages wherein the contact members of the socket are formed in a leadframe and the socket housing is overmolded around the leadframe, thus taking advantage of leadframe technology to simplify manufacture of the socket. The socket is particularly adapted for stackably interconnecting two small outline J-lead (SOJ) integrated circuit packages. However, Coller et al. do not teach a socket for stackably interconnecting more than two integrated circuit packages.

Other sockets for stackably interconnecting integrated circuit packages are known. See, for example, U.S. Pat. Nos. 4,116,519 (Grabbe et al.); 4,312,555 (Donaher et al.); 4,398,235 Lutz et al.); and 4,406,508 (Sadigh-Behzadi). Each of these patents discloses a socket for stacking standard chip carrier configurations such as DIP, SOIC, SOJ, and square packages.

The electronics industry experiences constant demand for further miniaturization of electronic components and their associated packaging. While each of the above references solves problems associated with stacking of chip carriers in order to reduce area required on a printed circuit board, further miniaturization requires that height of the stacked integrated circuit chips be reduced as well. The prior art stacking devices are adapted for stacking standard chip carriers, and the resulting package of stacked chip carriers has a minimum height which is equal to the sum of the heights of all of the chip carriers in the stack. There is a need for a device which will enable stacking of individual integrated circuit chips in a vertical array in order to provide a memory chip package having reduced overall height while maintaining the same memory capacity as the prior art devices.

Further, the chip carriers are typically retained in the prior art sockets by frictional engagement of the leads extending from the chip carriers. The leads must be of sufficient size and strength to withstand the frictional engagement without permanent deformation or breakage. For the DIP, SOIC, and SOJ chip carriers, the leads extend downwardly to below the overmolded body of the chip carrier. It would be advantageous for reduction of stacked height if the leads could be fashioned as thin strips extending outwardly from side edges of the chip and parallel to the chip. The prior art sockets are not suitable for electrically interconnecting chips having such leads. The present invention provides a socket for stacking a plurality of individual integrated circuit chips in a vertical array when the chips are attached to leadframes which define thin leads extending outwardly in a plane.

SUMMARY OF THE INVENTION

It is an object of the invention to provide a socket for an integrated circuit chip that is small and easy to manufacture.

It is another object of the invention to provide a socket for stacking a plurality of integrated circuit chips in a verticle array.

It is a further object of the invention to provide a socket for stacking integrated circuit chips that maintains a standard contact footprint.

It is yet another object of the invention to provide a socket for stacking integrated circuit chips that produces high quality electrical joints with leads of the chips stacked therein.

It is still another object of the invention to provide a socket for a stacked memory chip package that is smaller than the prior art stacked chip carrier packages.

These and other objects are accomplished by a socket that is specially adapted for use with a die and leadframe assembly comprising an integrated circuit chip, or die, which is attached to a leadframe. The lead frame is constructed so as to define electrical leads for the die, the leads extending in spaced relationship in a plane. The socket includes a dielectric base having a top surface for supporting the chip, and a bottom surface. The base holds a plurality of electrical contacts. Each of the contacts has a foot portion which extends below the bottom surface for electrical connection with a circuit trace on a substrate, and a main body portion which extends above the top surface for electrical connection with one of the leads. Each of the main body portions has a solder coating on one side. The contacts are arranged in the base such that the solder coated sides are in abutting relationship with respective ones of the leads, whereby the contacts are electrically connectable with the leads by reflow of the solder coating. Preferably, the main body portions extend sufficiently for electrical connection with leads from a plurality of die and leadframe assemblies that are stacked one above that other on the top surface of the base.

In another aspect of the invention, the contacts are substantially planar and are arranged parallel to each other in two parallel rows which extend perpendicular to a plane defined by one of the contacts. The foot portions of the contacts have surface mount lead portions that are arranged to define a dual in-line package footprint so that the socket may be used in place of a standard chip carrier.

In a further aspect of the invention, the contacts are disposed on opposite sides of a mid-plane such that each of the contacts has a remote side and a proximate with respect to the mid-plane, and the solder coating for each of the contacts is disposed on a same one of the remote and proximate sides. This aspect of the invention provides a means for reducing harmful effects of tolerance stacking so as to ensure abutting contact of the leads from each die with the solder coated sides of the contacts.

BRIEF DESCRIPTION OF THE DRAWINGS

There are shown in the drawings the embodiments of the invention that are presently preferred. It should be understood, however, that the invention is not limited to the precise arrangements and instrumentalities shown in the drawings, wherein:

FIG. 2 is a perspective exploded view of a socket according to the invention, showing a die and lead frame assembly to be mounted in the socket, and a cover for the socket.

DETAILED DESCRIPTION OF THE PREFERRED EMBODIMENT

Figure 1:
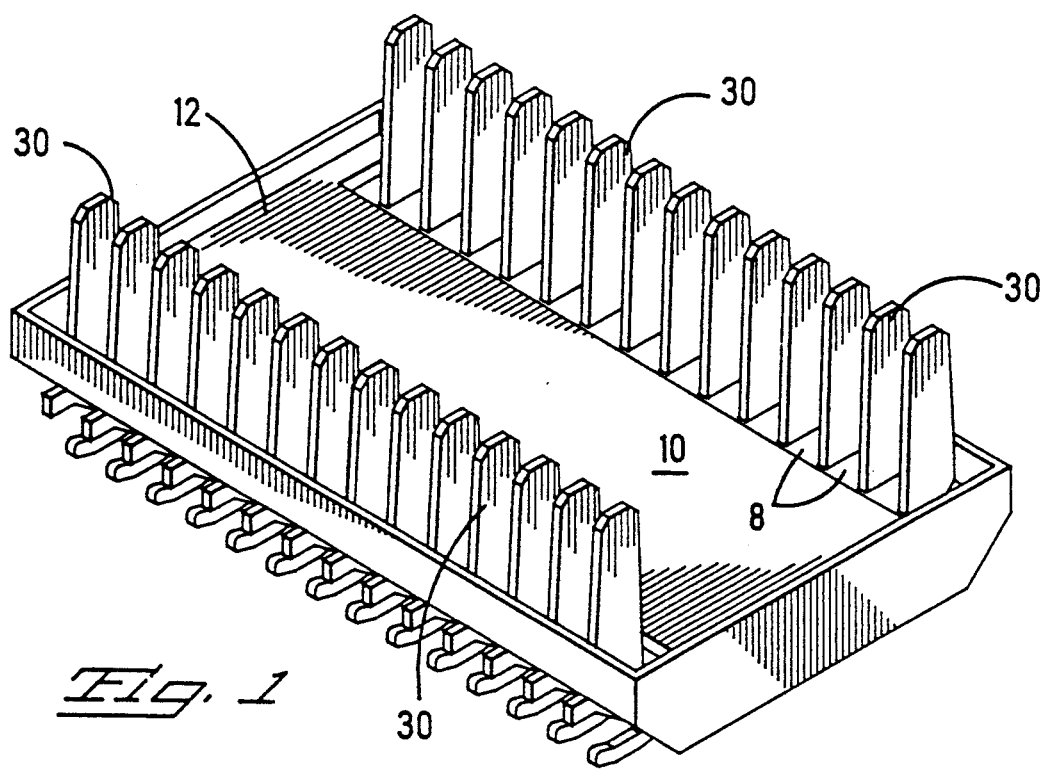
FIG. 1 is a perspective view of a socket for an integrated circuit chip according to the invention.
Figure 3:
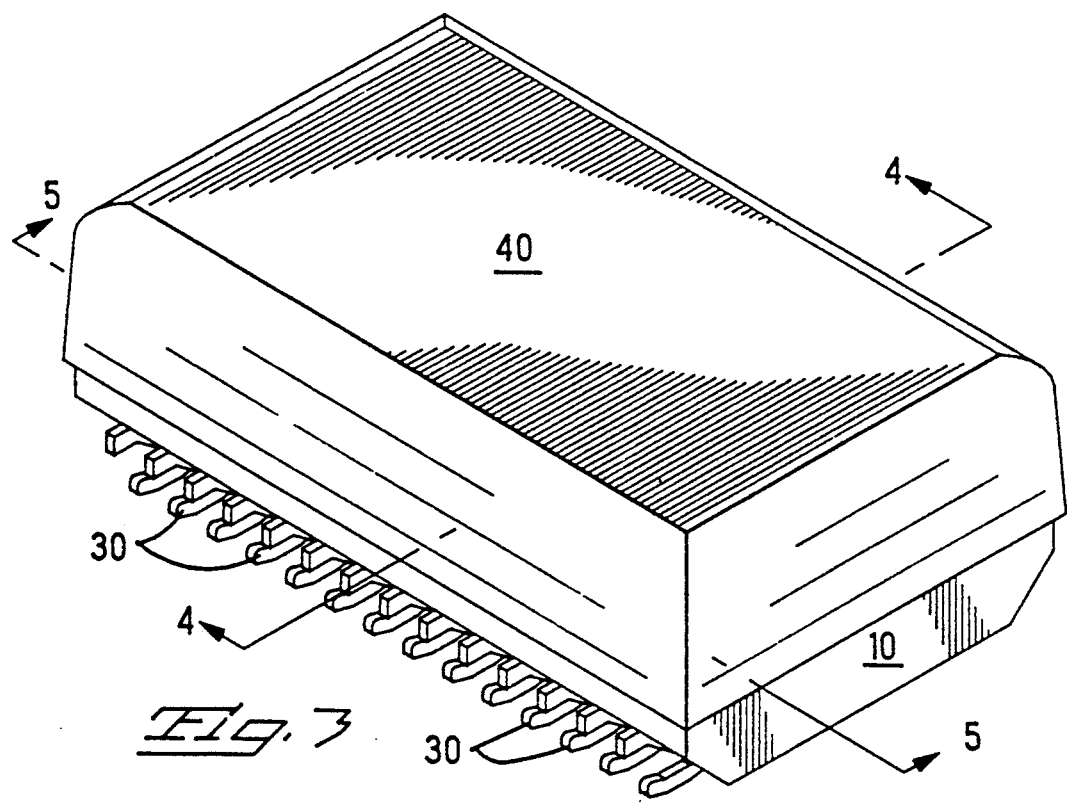
FIG. 3 is a perspective view of the socket and cover assembly shown in FIG. 2.
Figure 4:
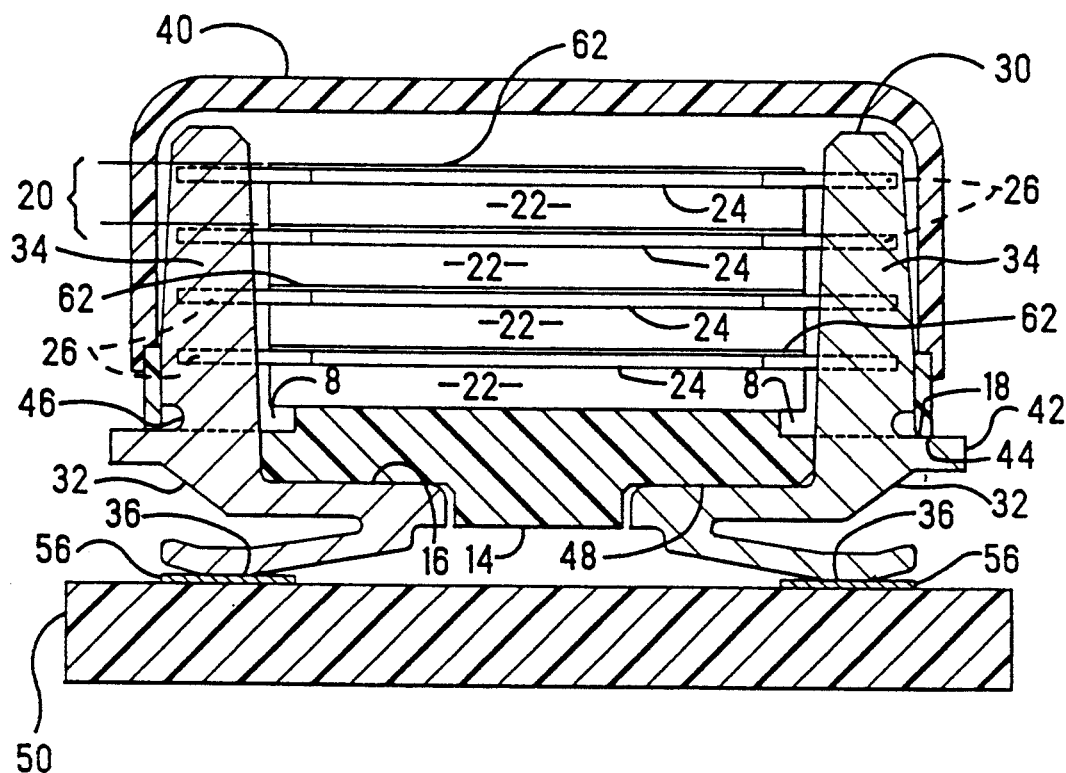
FIG. 4 is a cross-sectional view of the socket and cover assembly taken along line 4—4 of FIG. 3.

As shown in FIGS. 1, 2 and 4, a socket according to the invention comprises a dielectric base 10 having a top surface 12 and a bottom surface 14. A die and leadframe assembly, shown generally as 20, is supportable on the top surface 12. The die and leadframe assembly 20 includes an integrated circuit chip, or die, 22 which is bonded to a leadframe 24. The leadframe 24 is made from a thin metallic strip that is stamped or otherwise processed to provide an array of terminal leads 26 for the die 22. The leads 26 are electrically connected to the die 22 by a individual filamentary elements (not shown) according to a process that is not part of this invention. The leads 26 extend from the die in spaced relationship and are preferably co-planar.

The base 10 holds a plurality of electrical contacts 30. Each of the contacts 30 has a foot portion 32 which extends below the bottom surface 14 of the base 10 for electrical connection with one of a plurality of conductive mounting pads 56 connected to circuit traces on a circuit board or other substrate 50, as shown in FIG. 4. Each of the contacts 30 further has a main body portion 34 which extends above the top surface 12 of the base 10 for electrical connection with a respective one of the leads 26, thereby electrically connecting electrical circuits of the die 22 with respective ones of the mounting pads 56. As shown in the drawings, a cover 40 is attachable to the base 10 such as by bonding to provide a protective enclosure wherein the die and leadframe assembly 20 resides.

Figure 6:
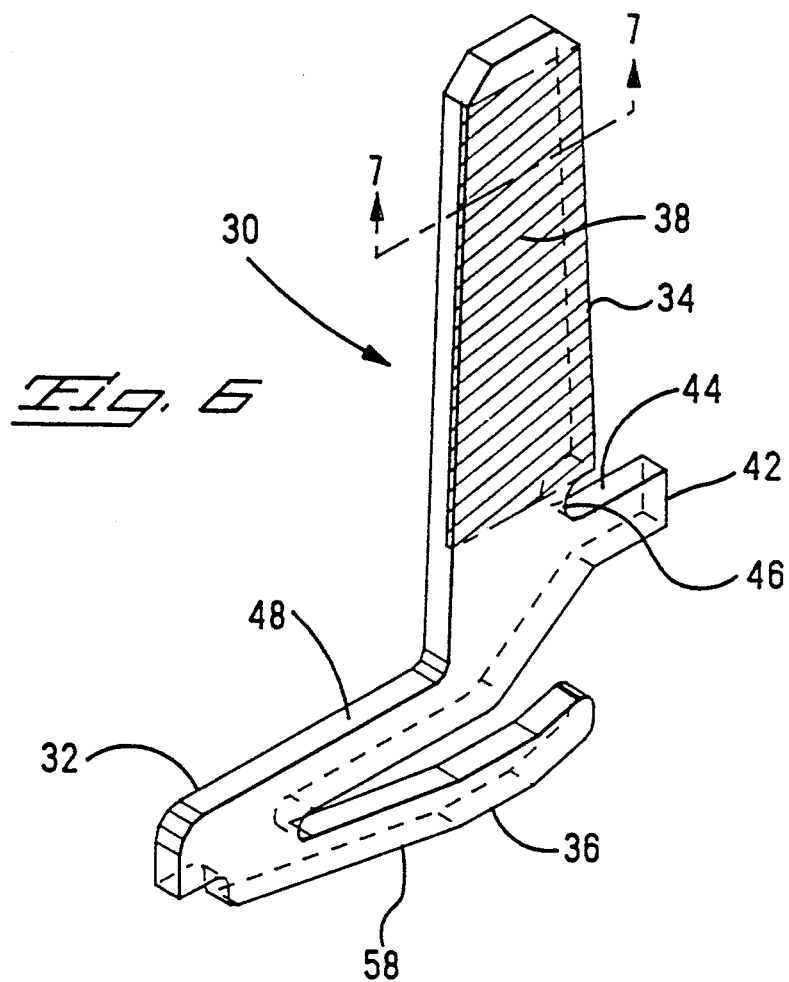
FIG. 6 is a perspective view of a contact for use in the socket according to the invention.
Figure 7:
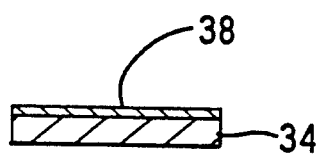
FIG. 7 is a cross-sectional view of a contact taken along line 7—7 of FIG. 6.

One of the contacts 30 is shown in perspective and cross-sectional views in FIGS. 6 and 7, respectively. The contacts 30 are stamped from thin, i.e., 0.010 inch, strips of phosphor bronze or other conductive material and are substantially planar. The main body portion 34 of each of the contacts 30 has a solder coating 38 on one side. The solder coating is preferably a tin or tin-lead inlay having a thickness of approximately 0.003 inch. The solder coating is provided on a side of the contact 30 which will electrically connect with one of the leads 26 of the die and leadframe assembly. According to the invention, some of the contacts 30 have the solder coating 38 on an opposite side of the contact than that shown in FIG. 6.

The foot portion 32 includes an extension 58 having a surface mount contact 36 having a thin surface layer of solder, as do the mounting pads 56. The solder on the surface mount contacts 36 and on the mounting pads 56 is heated to a molten state and then solidified to provide solder joints connecting the surface mount contacts 36 to respective ones of the mounting pads 56, according to a known process of reflow soldering. The extension 58 defines a cantilever beam which provides compliancy for the foot portion 32, thus enabling absorption of dimensional variations during temperature cycling due to coefficent of thermal expansion mismatch between the contacts 30 and the substrate 50.

The contacts 30 are frictionally held in contact receiving apertures 6, shown in FIG. 2, of the base 10. The apertures 6 are configured complementary to a cross-section of the contacts 30 and are dimensioned to frictionally retain the contacts 30 therein. The contacts 30 are inserted into the apertures 6 by a specially adapted automatic insertion machine. After insertion of the contacts 30, a sealing compound such as an elastomeric silicone sealer in a viscous or semi-viscous state is introduced into trough 8. Each of the contacts 30 includes a relief 46 into which the sealing compound can flow. The sealing compound is permitted to harden around the contacts 30 within the trough 8. The hardened sealing compound in the relief 46 acts as a key to lock the contacts 30 in the apertures 6. The sealing compound ensures retention of the contacts 30 in the apertures 6 and prevents water, dirt and other contaminants from entering the socket between the contacts 30 and walls of the apertures 6. An elastomeric sealing compound which remains pliable after hardening is preferred to allow slight position adjustment of the contacts during intallation of the die and leadframe assembly 20 in the socket.

Referring now to FIGS. 4 and 6, the foot portion 32 defines a positioning surface 48 that contacts an underside 16 of the base 10 during the insertion. Further, arm 42 of the contact 30 defines a positioning surface 44 which engages underside 18 of the base 10 when the contact 30 is fully inserted. The arm 42 also provides a means for aligning the surface mount contact 36 with its respective mounting pad 56. A manual or automatic vision system can be used to sight the arms 42 and align the arms 42 in planes defined by the respective mounting pads 56. Since the contacts 30 are substantially planar, the surface mount contacts 36 will then be co-planar with their respective mounting pads 56.

As shown in the drawings, the substantially planar contacts 30 are arranged parallel to each other in two parallel rows which extend perpendicular to a plane defined by one of the contacts 30. This arrangement provides a socket wherein the surface mount lead portions 36 have a standard DIP footprint for mating with standard DIP pattern mounting pads 56 on a printed circuit board. However, it will be understood by those skilled in the art that the contacts 30 could be arranged to have other standard footprints which have been or are hereafter adopted by the industry, and all such arrangements are considered to be within the scope of the invention.

Figure 5:
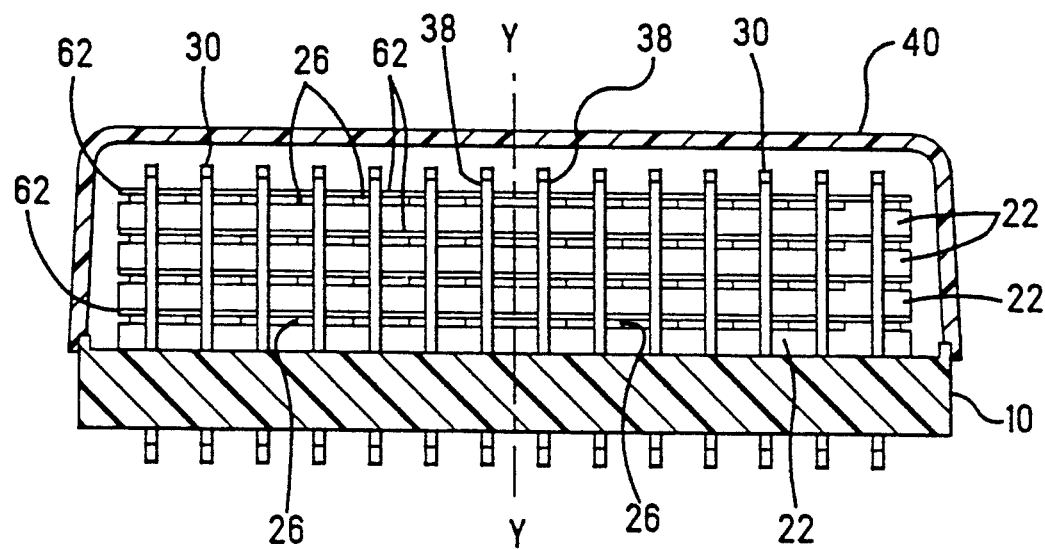
FIG. 5 is a cross-sectional view of the socket and cover assembly taken along line 5—5 of FIG. 3.

As shown in FIG. 5, the apertures 6 are spaced so that sides of the contacts 30 having the solder coatings 38 will align with respective ones of the leads 26 in order that each of the leads 26 will abut one of the solder coated sides 38 when the die and leadframe assembly 20 is introduced onto the top surface 12 of the socket. The solder coatings are caused to reflow during a heating operation and, upon re-solidification, electrical connections are formed between the contacts 30 and the leads 26. According to a preferred aspect of the invention, the contacts 30 are disposed on opposite sides of a vertically extending mid-plane Y—Y. Each of the contacts 30 has a side remote from the mid-plane and a side proximate to the mid-plane. For all of the contacts 30, the solder coating 38 is on the side of the contact which is remote from the mid-plane, and the leadframe 24 has the leads 26 disposed in a complementary arrangement so that the leads 26 abut the solder coated sides. This configuration provides a means for positioning the die and leadframe assembly 20 in the socket and prevents unwanted movement of the die and leadframe assembly prior to solder reflow attachment of the leads 26 to the contacts 30. If the solder coating 38 was provided on, for example, the left side of each of the contacts 30 in FIG. 5, the die and leadframe assembly would be free shift in position during handling of the socket prior to solder reflow, the leads 26 thereby separating from their respective solder coated sides of the contacts 30 such that solder reflow attachment to the contacts 30 would be impossible. By providing the solder coating 38 on the side of the contacts which is remote from the mid-plane Y—Y, the invention preserves abutting contact between the leads 26 and the contacts 30 at all times prior to solder reflow attachment.

As shown in FIGS. 4 and 5, the socket accommodates a plurality of die and leadframe assemblies 20 stacked one on top of the other. The main body portions 34 extend upward sufficiently for electrical connection with the leads 26 of the stacked die and leadframe assemblies. An electrically insulating layer 62 of tape or gel is disposed between each of the die and leadframe assemblies to prevent unwanted electrical communication therebetween.

The invention provides a number of advantages. A receptacle for a vertical stack of die and leadframe assemblies is provided. The invention interconnects the stacked assemblies to a circuit board, thus saving area covered on the circuit board. Height of the stacked assemblies is reduced compared to height of a stack of chip carriers having equivalent memory capacity. A reduced height memory chip package that is constructed using the invention has a footprint that permits mounting of the package in place of a standard package such as a dual in-line package.

The invention having been disclosed, a number of variations will now become apparent to those skilled in the art. Whereas the invention is intended to encompass the foregoing preferred embodiments as well as a reasonable range Of equivalents, reference should be made to the appended claims rather than the foregoing discussion of examples, in order to assess the scope of the invention in which exclusive rights are claimed.

I claim:

1. A socket for supporting an integrated circuit chip and electrically connecting said chip to circuit traces on a substrate, said chip having electrical leads extending therefrom in respective outward directions in a spaced relationship, said socket comprising:

a dielectric base defining a top surface for supporting said chip, and a bottom surface, the base holding a plurality of electrical contacts, each of said contacts having a foot portion which extends below the bottom surface for electrical connection with one of said traces, and a main body portion which extends above the top surface for electrical connection with one of said leads, said body portions being associated with respective said leads, each of the main body portions having a solder coating on a side thereof, said solder coated sides being in a spaced relationship corresponding to the spaced relationship of said leads and extending beside their respective said leads in respective directions parallel to the respective outward directions of their respective said leads such that said sides are in abutting relationship with their respective said leads when said chip is disposed in said socket, whereby said contacts are electrically connectable with said leads by reflow of said solder coating.

2. The socket according to claim 1, further comprising a cover attachable to the base for enclosing the main body portions.

3. The socket according to claim 1, wherein the contacts are substantially planar and are arranged parallel to each other.

4. The socket according to claim 3, wherein the contacts are arranged in two parallel rows which extend perpendicular to a plane defined by one of the contacts.

5. The socket according to claim 4, wherein the foot portions have surface mount lead portions that are arranged to define a dual in-line package footprint.

6. The socket according to claim 1, wherein the contacts are disposed on opposite sides of a mid-plane such that each of the contacts has a remote side and a proximate side with respect to the mid-plane, and the solder coatings for the contacts are disposed on respective same ones of the remote and proximate sides.

7. The socket according to claim 1, wherein the contacts are frictionally held in the base.

8. The socket according to claim 1, wherein the solder coating is a thin inlay.

9. The socket according to claim 1, wherein the solder coating is a tin-lead inlay.

10. The socket according to claim 1, wherein the main body portions extend sufficiently for electrical connection with a plurality of said leads extending from a plurality of said chips in stacked relationship on said top surface.

11. The socket according to claim 1, wherein the contacts are disposed on opposite sides of a mid-plane such that each of the contacts has a remote side and a proximate side with respect to the mid-plane, and the solder coatings for at least two of the contacts are disposed on respective different ones of the remote and proximate sides.

* * * * *

UNITED STATES PATENT AND TRADEMARK OFFICE
CERTIFICATE OF CORRECTION

PATENT NO. : 5,330,359
DATED : July 19, 1994
INVENTOR(S) : Kevin E. Walker

It is certified that error appears in the above-indentified patent and that said Letters Patent is hereby corrected as shown below:

IN THE CLAIMS :

Claim 8, Column 6, Line 52 - "thin" should be --tin--

Signed and Sealed this

Eighth Day of August, 1995

Attest:

BRUCE LEHMAN

Attesting Officer

Commissioner of Patents and Trademarks